US 6,541,859 B1

(12) United States Patent
Forbes et al.

(10) Patent No.: US 6,541,859 B1
(45) Date of Patent: \*Apr. 1, 2003

(54) METHODS AND STRUCTURES FOR SILVER INTERCONNECTIONS IN INTEGRATED CIRCUITS

(75) Inventors: Leonard Forbes, Corvallis, OR (US); Paul A. Farrar, So. Burlington, VT (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 22 days.

This patent is subject to a terminal disclaimer.

(21) Appl. No.: 09/614,492

(22) Filed: Jul. 11, 2000

Related U.S. Application Data (62) Division of application No. 09/030,113, filed on Feb. 25, 1998, now Pat. No. 6,143,655.

(51) Int. Cl.$^7$ .............................................. H01L 23/48

(52) U.S. Cl. ..................... 257/742; 757/743; 757/522

(58) Field of Search ................................ 257/742, 743, 257/744, 745, 276, 616, 522

(56) References Cited

U.S. PATENT DOCUMENTS

| | | | |
|---|---|---|---|
| 3,571,674 A | 3/1971 | Yu et al. ...................... | 317/235 |
| 3,932,226 A | 1/1976 | Klatskin et al. ............... | 204/16 |
| 4,157,269 A | 6/1979 | Ning et al. .................... | 148/1.5 |
| 4,169,000 A * | 9/1979 | Riseman ....................... | 148/187 |
| 4,234,357 A | 11/1980 | Scheppele .................... | 148/1.5 |
| 4,252,582 A | 2/1981 | Anantha et al. ............. | 148/175 |
| 4,442,449 A | 4/1984 | Lehrer et al. ................. | 357/67 |
| 4,470,852 A | 9/1984 | Ellsworth et al. ............ | 148/1.5 |

(List continued on next page.)

FOREIGN PATENT DOCUMENTS

JP          03-222367        10/1991    ......... H01L/29/784

(List continued on next page.)

OTHER PUBLICATIONS

*The Handbood of Binary Phase Diagrams, 4*, Genium Publishing, results summarized from the Constitution of Binary Alloys, pp. 916–919, 1985; First Supplement to Constitution of Binary Alloys, pp. 508–509, 1985; Second Supplement to Constitution of Binary Alloys, pp. 494–495, 1985, 10 pages, (1987).

(List continued on next page.)

*Primary Examiner*—Jerome Jackson
*Assistant Examiner*—Lourdes Cruz
(74) *Attorney, Agent, or Firm*—Schwegman, Lundberg, Woessner & Kluth, P.A.

(57) ABSTRACT

A typical integrated-circuit fabrication requires interconnecting millions of microscopic transistors and resistors with aluminum wires. Making the aluminum wires flush, or coplanar, with underlying insulation requires digging trenches in the insulation, and then filling the trenches with aluminum to form the aluminum wires. Trench digging is time consuming and costly. Moreover, aluminum has higher electrical resistance than other metals, such as silver. Accordingly, the invention provides a new "self-trenching" or "self-planarizing" method of making coplanar silver wires. Specifically, one embodiment forms a first layer that includes silicon and germanium; oxidizes a region of the first layer to define an oxidized region and a non-oxidized region; and reacts silver with the non-oxidized region. The reaction substitutes, or replaces, the non-oxidized region with silver to form silver wires coplanar with the first layer. Another step removes germanium oxide from the oxidized region to form a porous insulation having a very low dielectric constant, thereby reducing capacitance. Thus, the present invention not only eliminates the timing-consuming, trench-digging step of conventional methods, but also reduces resistance and capacitance which, in turn, enable faster, more-efficient integrated circuits.

25 Claims, 3 Drawing Sheets

U.S. PATENT DOCUMENTS

| | | | |
|---|---|---|---|
| 4,483,726 A | 11/1984 | Isaac et al. | 148/187 |
| 4,507,673 A | 3/1985 | Aoyama et al. | 357/23 R |
| 4,507,847 A | 4/1985 | Sullivan | 29/576 |
| 4,651,409 A | 3/1987 | Ellsworth et al. | 29/576 B |
| 4,670,297 A | 6/1987 | Lee et al. | 427/91 |
| 4,702,941 A | 10/1987 | Mitchell et al. | 427/250 |
| 4,800,177 A | 1/1989 | Nakamae | 437/193 |
| 4,855,252 A | 8/1989 | Peterman | 437/189 |
| 4,857,481 A | 8/1989 | Tam et al. | 437/182 |
| 4,893,273 A | 1/1990 | Usami | 365/185 |
| 4,959,705 A | 9/1990 | Lemnios | 257/522 |
| 5,010,039 A | 4/1991 | Ku et al. | 437/228 |
| 5,040,049 A | 8/1991 | Raaijmakers | 357/71 |
| 5,051,805 A | 9/1991 | Custode | 357/34 |
| 5,111,430 A | 5/1992 | Morie | 365/185 |
| 5,148,260 A | 9/1992 | Inoue et al. | 257/276 |
| 5,158,986 A | 10/1992 | Cha et al. | 521/82 |
| 5,187,560 A | 2/1993 | Yoshida et al. | 257/743 |
| 5,241,193 A | 8/1993 | Pfiester et al. | 257/67 |
| 5,260,593 A | 11/1993 | Lee | 257/316 |
| 5,268,315 A | 12/1993 | Prasad et al. | 437/31 |
| 5,280,188 A | 1/1994 | Iwasaki | 257/370 |
| 5,293,560 A | 3/1994 | Harari | 365/185 |
| 5,308,440 A | 5/1994 | Chino et al. | 156/664 |
| 5,317,535 A | 5/1994 | Talreja et al. | 365/185 |
| 5,324,684 A | 6/1994 | Kermani et al. | 437/95 |
| 5,334,356 A | 8/1994 | Baldwin et al. | 422/133 |
| 5,341,016 A | 8/1994 | Prall et al. | 257/412 |
| 5,369,040 A | 11/1994 | Halvis et al. | 437/3 |
| 5,371,035 A | 12/1994 | Pfiester et al. | 437/69 |
| 5,388,069 A | 2/1995 | Kokubo | 365/185 |
| 5,391,911 A * | 2/1995 | Beyer et al. | 257/522 |
| 5,424,993 A | 6/1995 | Lee et al. | 365/218 |
| 5,436,496 A | 7/1995 | Jerome et al. | 257/529 |
| 5,438,544 A | 8/1995 | Makino | 365/185 |
| 5,442,226 A | 8/1995 | Maeda et al. | 257/557 |
| 5,449,941 A | 9/1995 | Yamazaki et al. | 257/411 |
| 5,454,928 A | 10/1995 | Rogers et al. | 205/125 |
| 5,458,702 A | 10/1995 | Ono et al. | 148/432 |
| 5,465,249 A | 11/1995 | Cooper et al. | 365/149 |
| 5,467,306 A | 11/1995 | Kaya et al. | 365/185.2 |
| 5,470,801 A | 11/1995 | Kapoor et al. | 437/238 |
| 5,477,485 A | 12/1995 | Bergemont et al. | 365/185.24 |
| 5,493,140 A | 2/1996 | Iguchi | 257/316 |
| 5,501,645 A | 3/1996 | Taniguchi et al. | 477/130 |
| 5,508,543 A | 4/1996 | Hartstein et al. | 257/314 |
| 5,510,645 A | 4/1996 | Fitch et al. | 257/522 |
| 5,512,785 A | 4/1996 | Haver et al. | 257/758 |
| 5,516,724 A | 5/1996 | Ast et al. | 437/160 |
| 5,516,745 A | 5/1996 | Friesen et al. | 502/401 |
| 5,530,581 A | 6/1996 | Cogan | 359/265 |
| 5,539,227 A | 7/1996 | Nakano | 257/276 |
| 5,541,124 A | 7/1996 | Miwa et al. | 437/31 |
| 5,563,448 A | 10/1996 | Lee et al. | 257/742 |
| 5,580,380 A | 12/1996 | Liu et al. | 117/86 |
| 5,593,921 A | 1/1997 | Chen et al. | 437/195 |
| 5,639,979 A | 6/1997 | Chen et al. | 84/615 |
| 5,643,806 A | 7/1997 | Miwa et al. | 437/31 |
| 5,648,280 A | 7/1997 | Kato | 437/31 |
| 5,670,790 A | 9/1997 | Katoh et al. | 257/14 |
| 5,698,890 A | 12/1997 | Sato | 257/592 |
| 5,705,425 A * | 1/1998 | Miura et al. | 437/182 |
| 5,710,454 A | 1/1998 | Wu | 257/413 |
| 5,723,378 A | 3/1998 | Sato | 438/309 |
| 5,731,240 A | 3/1998 | Kataoka | 438/364 |
| 5,753,967 A | 5/1998 | Lin | 257/635 |
| 5,757,072 A | 5/1998 | Gorowitz et al. | 257/522 |
| 5,796,151 A | 8/1998 | Hsu et al. | 257/410 |
| 5,796,166 A | 8/1998 | Agnello et al. | 257/751 |
| 5,798,544 A | 8/1998 | Ohya et al. | 257/296 |
| 5,798,559 A * | 8/1998 | Bothra et al. | 257/522 |
| 5,801,444 A | 9/1998 | Aboelfotoh et al. | 257/762 |
| 5,847,439 A * | 12/1998 | Reinberg | 257/522 |
| 5,861,340 A | 1/1999 | Bai et al. | 438/592 |
| 5,891,797 A | 4/1999 | Farrar | 438/619 |
| 5,920,121 A * | 7/1999 | Forbes et al. | 257/742 |
| 5,925,918 A | 7/1999 | Wu et al. | 257/413 |
| 5,925,933 A | 7/1999 | Colgan et al. | 257/762 |
| 5,930,596 A | 7/1999 | Klose et al. | 438/98 |
| 5,930,668 A | 7/1999 | Gardner | 438/624 |
| 5,942,799 A | 8/1999 | Danek et al. | 257/751 |
| 5,960,313 A | 9/1999 | Jun | 438/624 |
| 5,989,718 A | 11/1999 | Smith et al. | 428/446 |
| 6,025,261 A | 2/2000 | Farrar et al. | 438/619 |
| 6,080,646 A | 6/2000 | Wang | 438/585 |
| 6,150,252 A | 11/2000 | Hsu et al. | 438/597 |
| 6,157,082 A | 12/2000 | Merchant et al. | 257/758 |
| 6,180,509 B1 | 1/2001 | Huang et al. | 438/624 |
| 6,211,562 B1 | 4/2001 | Forbes et al. | 257/581 |
| 6,245,663 B1 * | 6/2001 | Zhao et al. | 438/622 |
| 6,265,602 B1 | 7/2001 | Voit et al. | 558/459 |
| 6,271,551 B1 * | 8/2001 | Schmitz et al. | 257/288 |

FOREIGN PATENT DOCUMENTS

| | | | | |
|---|---|---|---|---|
| JP | 06-224431 | 8/1994 | | H01L/29/784 |
| JP | 06-302828 | 10/1994 | | H01L/29/788 |
| JP | 08-255878 | 10/1996 | | H01L/27/10 |

OTHER PUBLICATIONS

Akasaki, I., et al., "Effects of AlN Buffer Layer on Crystallographic Structure and on Electrical and Optical Properties of GaN and Ga(1–x)Al(x)N [0< x (< or =) 0.4] Films Grown of Sapphire Substrate by MOVPE", *J. Crystal Growth, 98*, 209–219, (1989).

Alok, D., et al., "Electrical Properties of Thermal Oxide Grown on N–type 6H–Silicon Carbide", *Applied Physics Letters, 64,* 2845–2846, (May 23, 1994).

Andrieux, M., et al., "Interface and Adhesion of PACVD SiC Based Films on Metals", *Supp. Le Vide: science, technique et applications, 279,* 212–214, (1996).

Yee, A., et al., "The Effect of Nitrogen on Pulsed Laser Deposition of Amorphous Silicon Carbide Films: Properties and Structure", *J. Materials Research, 11,* 1979–1986, (1996).

Yoder, M., "Wide Bandgap Semiconductor Materials and Devices", *IEEE Transactions on Electron Devices, 43,* 1633–1636, (Oct. 1996).

Zhao, X., et al., "Nanocrystalline Si: a material constructed by Si quantum dots", *1st Int. Conf. on Low Dimensional Structures and Devices, Singapore,* 467–471, (1995).

Ashburn, P., et al., "Comparison of Experimental and Theoretical Results on Polysilicon Emitter Bipolar Transistors", *IEEE Trans. on Electron Devices, vol. Ed–31,* 853–60, (1984).

Bachmann, P., et al., "Influence on Surface Modifications on the Electronic Properties of CVD Diamond Films", *Diamond and Related Materials, 5,* 1378–1383, (1996).

Baglee, D., "Characterisitcs & Reliability of 100 Angstrom Oxides", *IEEE 22nd Annual Proc.: Reliability Physics,* Las Vegas, 152–155, (Apr. 3–5, 1984).

Beheim, G., et al., "Magnetron Plasma Etching of SiC for Microstructures", *Proc: SPIE—Integrated Optics and Microstructures III,* San Jose, CA, 82–86, (Jan. 29, 1996).

Bengtsson, S., et al., "Applications of Aluminum Nitride Films Deposited by Reactive Sputtering to Silicon–On–Insulator Materials", *Japanese J. Applied Physics, 35,* 4175–4181, (1996).

Benjamin, M., et al., "UV Photoemission Study of Heteroepitaxial AlGaN Films Grown on 6H–SiC", *Applied Surface Science, 104/105,* 455–460, (1996).

Bermudez, V., et al., "The Growth and Properties of Al and AlN Films on GaN(0001)–(1 x 1)", *J. Applied Physics, 79,* 110–119, (Jan. 1996).

Boeringer, D.W., et al., "Avalanche amplificaition of multiple resonant tunneling through parallel silicon microcrystallites", *Physical Rev. B, 51,* 13337–13343, (1995).

Campbell, S.A., *The Science and Engineering of Microelectronic Fabrication,* Oxford University Press, 476, (1996).

Casey, H., et al., "Low Interface Trap Density for Remote Plasma Deposited SiO2 on n–type GaN", *Applied Phys. Lett., 68,* 1850–1852, (Mar. 1996).

Chang, C., et al., "Novel Passivation Dielectrics–The Boron– or Phosphorus–Doped Hydrogenated Amorphous Silicon Carbide Films", *Journal of the Electrochemical Society, 132,* 418–422, (Feb. 1985).

Choi, J., et al., "Effect of Deposition Conditions and Pretreatments on the Microstructure of MPECVD Diamond Thin Films", *Materials Chemistry and Physics, 45,* 176–179, (1996).

Chor, E.F., et al., "Emitter Resistance of Arsenic– and Phosphorus–Doped Polysilicon Emitter Transistors", *IEEE Trans. on Electron Devices, 6(10),* pp. 516–518, (Oct. 1985).

Clarke, G., et al., "The Infrared Properties of Magnetron–Sputtered Diamond–Like Thin Films", *Thin Solid Films, 280,* 130–135, (1996).

Compagnini, G., et al., "Spectroscopic Characterization of Annealed Si(1–x)C(x) Films", *J. Materials Res., 11,* 2269–2273, (Sep. 1996).

Dartnell, N., et al., "Reactive Ion Etching of Silicon Carbide (Si(x)C(1–x))", *Vacuum, 46,* 349–355, (1995).

Demichelis, F., et al., "Influence of Doping on the Structural and Optoelectronic Properties of Amorphous and Microcrystalline Silicon Carbide", *Journal of Applied Physics, 72,* 1327–1333, (Aug. 15, 1992).

Demichelis, F., et al., "Physical Properties of Undoped and Doped Microcrystalline SiC: Deposited By PECVD", *Materials Research Society Symposium Proceedings, 219,* Anaheim, CA, 413–418, (Apr. 30–May 3, 1991).

Dipert, B., et al., "Flash Memory Goes Mainstream", *IEEE Spectrum, 30,* 48–52, (Oct. 1993).

Edelberg, E., et al., "Visible Luminescence from Nanocrystalline silicon films produced by plasma enhance chemical vapor deposition", *Appl. Phys. Lett., 68,* 1415–1417, (1996).

Fissel, et al., "Epitaxial Growth of SiC Thin Films on Si–stabilized alpha–SiC (0001) at Low Temperatures by Solid–source Molecular Beam Epitaxy", *Journal of Crystal Growth, 154,* 72–80, (1995).

Friedrichs, P., et al., "Interface Properties of Metal–Oxide–Semiconductor Structures on N–type 6H and 4H–SiC", *J. Applied Physics, 79,* 7814–7819, (May 15, 1996).

Fujii, T., et al., "Bonding Structures in Highly Photoconductive a–SiC:H Films Deposited by Hybrid–Plasma Chemical Vapor Deposition", *Journal of Non–Crystalline Solids, 198–200,* 577–581, (1996).

Goetzberger, A., et al., *Applied Solid State Science: Advances in Materials and Device Research,* R. Wolfe, ed., Academic Press, New York, Including p. 233, (1969).

Graul, J., et al., "Growth Mechanism of Polycrystalline beta–SiC Layers on Silicon Substrate", *Applied Phys. Lett., 21,* 67–69, (Jul. 1972).

Hamakawa, Y., et al., "Opteolectronics and Photovoltaic Applications of Microcrystalline SiC", *Materials Research Society Symposium Proceedings, 164,* Boston, MA, 291–301, (Nov. 29–Dec. 1, 1989).

He, Z., et al., "Ion–beam–assisted Deposition of Si–carbide Films", *Thin Solid Films, 260,* 32–37, (1995).

Hu, G., et al., "Will Flash Memory Replace Hard Disk Drive?", *1994 IEEE International Electron Device Meeting,* Panel Discussion, Session 24, Outline 2 pages, (Dec. 1994).

Hwang, J., et al., "High Mobility beta–SiC Epilayer Prepared by Low–pressure Rapid Thermal Chemical Vapor Deposition on a (100) Silicon Substrate", *Thin Solid Films, 272,* 406, (1996).

Hybersten, M.S., "Absorption and Emission of Light in Nanoscale Silicon Structures", *Phys. Rev. Lett., 72,* 1514–1517, (1994).

Jou, S., et al., "Electron Emission Characterization of Diamond Thin Films Grown from a Solid Carbon Source", *Thin Solid Films, 280,* 256–261, (1996).

Kato, M., et al., "Read–Disturb Degradation Mechanism due to Electron Trapping in the Tunnel Oxide for Low–voltage Flash Memories", *IEEE Electron Device Meeting,* 45–48, (1994).

Kothandaraman, M., et al., "Reactive Ion Etching of Trenches in 6H–SiC", *J. Electronic Materials, 25,* 875–878, (1996).

Kumbhar, A., et al., "Growth of Clean Amorphous Silicon–Carbon Alloy Films by Hot–Filament Assisted Chemical Vapor Deposition Technique", *Applied Phys. Lett, 66,* 1741–1743, (Apr. 1995).

Lakshmi, E., et al., "Interference–State Characteristics of GaN/GaAs MIS Capacitors", *Solid–State Electronics, 25,* 811–815, (1982).

Lanois, F., et al., "Angle Etch Control for Silicon Carbide Power Devices", *Applied Phys. Lett., 69,* 236–238, (Jul. 1996).

Lau, S., et al., "Optoelectronic Properties of Highly Conductive Microcrystalline SiC Produced by Laser Crystallization of Amorphous SiC", *J. of Non–Crystalline Solids, 198–200,* 907–910, (1996).

Leggieri, G., et al., "Laser Ablation Deposition of Silicon Carbide Films",*Applied Surface Science, 96–98,* 866–869, (1996).

Lei, T., et al., "Epitaxial Growth and Characterization of Zinc–Blende Gallium Nitride on (001) Silicon", *J. Appl. Phys., 71,* 4933–4943, (May 1992).

Liu, J., et al., "Formation of SiC Films on Silicon Field Emitters", *Materials Res. Soc. Symp. Proc., 311,* San Francisco, CA, (Apr. 13–15, 1993).

Liu, J., et al., "Modification of Si Field Emitter Surfaces by Chemical Conversion to SiC",*J. Vac. Sci. Technology, B 12,* 717–721, (1994).

Luo, J., et al., "Localized Epitaxial Growth of Hexagonal and Cubic SiC Films on Si by Vacuum Annealing", *Applied Phys. Lett., 69,* 916–918, (Aug. 1996).

Martins, R., et al., "Transport Properties of Doped Silicon Oxycarbide Microcrystalline Films Produced by Spatial Separation Techniques", *Solar Energy Materials and Solar Cells, 41–42,* 493–517, (1996).

Martins, R., et al., "Wide Band Gap Microcrystalline Silicon Thin Films", *Diffusion and Defect Data : Solid State Phenomena, 44–46, Part 1,* Scitec Publications, 299–346, (1995).

Maury, F., et al., "Chemical Vapor Co–Deposition of C and SiC at Moderate Temperautre for the Synthesis of Compositionally Modulated Si(x)C(1–x) Ceramic Layers", *Surface and Coatings Technology, 76–77,* 119–125 (1995).

McLane, G., et al., "High Etch Rates of SiC in Magnetron Enhanced SF(6) Plasmas", *Applied Phys. Lett., 68,* 3755–3757, (Jun. 1996).

Moffatt, W.G., *The Handbook of Binary Phase Diagrams,* General Electric Company, p. 11/84, Mar. 1984, (1978).

Moffatt, W.G., *The Handbook of Binary Phase Diagrams, 2,* Genium Publishing Corporation, p. 6/80, (1984).

Mogab, C., et al., "Conversion of Si to Epitaxial SiC by Reaction with C(2)H(2)", *J. Applied Physics, 45,* 1075–1084, (Mar. 1974).

Moller, H., et al., "In–situ p– and n–Doping of Low Temperature Grown Beta–SiC Epitaxial Layers on Silicon", *Proc. of International Conference on Silicon Carbide and Related Materials,* IOP Publishing, UK, 497–500, (1996).

Molnar, R., et al., "Growth of Gallium Nitride by Electron–Cyclotron Resonance Plasma–Assisted Molecular–Beam Epitaxy: The Role of Charged Species", *J. Appl. Phys., 76,* 4587–4595, (1994).

Muller, K., et al., "Trench Storage Node Technology for Gigabit DRAM Generations", *Digest IEEE International Electron Devices Meeting,* San Francisco, CA, 507–510, (Dec. 1996).

Nemanich, P., et al., "Diamond Negative Electron Affinity Surfaces, Structures and Devices", *Proc. : Third International Conference on Applications of Diamond Films and Related Materials, 1,* Gaithersburg, MD, 17–24, (1995).

Nemanich, R., et al., "Negative Electron Affinity Surfaces of Aluminum Nitride and Diamond", *Diamond and Related Materials, 5,* 790–796, (1996).

Ouyang, M., et al., "Deposition of Diamond–Like Carbon Films via Excimer Laser Ablation of Polybutadiene", *Materials Science and Engineering, B39,* 228–231, (1996).

Pankove, J., "Photoelectric Emission", *In: Optical Processes in Semiconductors,* Dover Publications Inc., New York, 287–301, (1971).

Pankove, J., et al., "Photoemission from GaN", *Applied Phys. Lett., 25,* 53–55, (1974).

Papadas, C., et al., "Modeling of the Intrinsic Retention Characteristics of FLOTOX EEPROM Cells Under Elevated Temperature Conditions", *IEEE Transaction on Electron Devices, 42,* 678–682, (Apr. 1995).

Patuwathavithane, C., et al., "Oxidation Studies for 6H–SiC", *Proc: 4th Int. Conf. on Amorphous and Crystalline Silicon Carbide IV,* Santa Clara, CA, 163–169, (Oct. 9–11, 1991).

Pereyra, I., et al., "Wide Gap a–Si(1–x)C(x): H Thin Films Obtained Under Starving Plasma Deposition Conditions",*J. Non–Crystalline Solids, 201,* 110–118, (1996).

Pollack, S., "Electron Transport Through Insulating Thin Films", *Appl. Solid–State Science, 1,* 345–355, (1969).

Prendergast, J., "Flash or DRAM: Memory Choice for the Future", *IEEE Electron Device Meeting, Session 25,* Phoenix, AZ, (1995).

Rahman, M., et al., "Preparation and Electrical Properties of An Amorphous SiC/ Crystalline Si p(+) in Heterostructure", *Japanese J. Applied Physics, 23,* 515–524, (May 1984).

Renlund, G., et al., "Silicon Oxycarbide Glasses: Part I. Preparation and Chemistry", *Journal of Materials Research, 6,* 2716–2722, (Dec. 1991).

Renlund, G., et al., "Silicon Oxycarbide Glasses: Part II. Structure and Properties", *Journal of Materials Research, 6,* 2723–2734, (Dec. 1991).

Schmidt, I., et al., "Low Temperature Diamond Growth Using Fluorinated Hydrocarbons", *Diamond and Related Materials, 5,* 1318–1322, (1996).

Schoenfeld, O., et al., "Formation of Si Quantum dots in Nanocrystalline silicon", *Proc. 7th Int. Conf. on Modulated Semiconductor Structures, Madrid,* 605–608, (1995).

Serre, C., et al., "Ion–Beam Synthesis of Amorphous SiC Films: Structrural Analysis and Recrystallization", *J. Appl. Phys., 79,* 6907–6913, (May 1996).

Shafi, Z.A., et al., "Poly–Crystalline Silicon–Carbide (SiC) Emitter Bipolar Transistors", *IEEE Bipolar Circuits and Technology Meeting,* Minneapolis, MN, 67–70, (1991).

Sim, S., et al., "A New Planar Stacked Technology (PST) for Scaled and Embedded DRAMs", *Digest IEEE Int. Electron Devices Meeting,* San Francisco, CA, 504–507, (Dec. 1996).

Suzaki, Y., et al., "Quantum Size Effects of a–Si(:H)/a–SiC(:H) Multilayer Films Prepared by rf Sputtering", *Abstracts of Papers Published in the Int. J. Japenese Soc. for Precision Engineering, 28,* Abstract of Paper in vol. 60, 182, (Jun. 1994).

Svirkova, N., et al., "Deposition Conditions and Density–of–States Spectrum of a–Si(1–x)C(x) :H Films Obtained by Sputtering", *Semiconductors, 28,* 1164–1169, (Dec. 1994).

Sze, S., *Physics of Semiconductors,* 2nd Edition., John Wiley & Sons, Pub., New York, ISBN 0471056618, (1981).

Tarui, Y., "Flash Memory Features Simple Structure, Superior Integration", *JEE, 30,* 84–87, (Sep. 1993).

Tenhover, M., et al., "CD–Magnetron Sputtered Silicon Carbode", *Materials Res. Soc. Symp. Proc., 356,* Boston, MA, 227–232, (Nov. 28–Dec. 2, 1994).

Thomas J., et al., "Plasma Etching and Surface Analysis of a–SiC :H Films Deposited by Low Temperature Plasma Enhanced Chemcial Vapor Deposition", *Materials Res. Soc. Symp. Proc., 334,* Boston, MA, 445–450, (Nov. 29–Dec. 2, 1993).

Tiwari, S., et al., "A silicon nanocrystal based memory", *Appl. Physics Lett., 68,* 1377–1379, (1996).

Tiwari, S., et al., "Volatile and Non–Volatile Memories in Silicon with Nano–Crystal Storage", *Int'l Electron Devices Meeting: Technical Digest,* Washington, DC, 521–524, (Dec. 1995).

Tsu, R., et al., "Slow Conductance oscillations in nanoscale silicon clusters of quantum dots", *Appl. Phys. Lett., 65,* 842–844, (1994).

Tsu, R., et al., "Tunneling in Nanoscale Silicon Particles Embedded in an a–SiO2 Matrix", *Abstract, IEEE Device Research Conference,* pp. 178–179, (1996).

Tucker, C., et al., "Ion–beam–assisted Deposition of Non-hydrogenated a–Si:C Films", *Can. J. Physics, 74,* 97–101, (1996).

Uchino, T., et al., "Very High Speed Silicon Bipolar Transistors with In–Situ Doped Polysilicon Emitter and Rapid Vapor–Phase Doping Base", *IEEE Trans. on Electron Devices, vol. 42, No. 1,* 406–12, (1995).

van der Weide, J., et al., "Negative–electron–affinity Effects on the Diamond (100) Surface", *Physical Review B[Condensed Matter], 50,* 5803–5806, (Aug. 15, 1994).

Villars, P., et al., *Handbook of Ternary Alloy Phase Diagrams, vol. 3,* ASM International, 2893–99.

Vodakov, Y., et al., "Difusion and Solubility of Impurities in Silicon Carbide", *In: Silicon Carbide,* R.C. Marshall, et al., eds., Univ. of South Carolina Press, 508–519, (1973).

Wahab, Q., et al., "3C–SiC / Si / 3C–SiC Epitaxial Trilayer Films Deposited on Si (111) Substrates by Reactive Magnetron Sputtering", *J. Materials Res., 10,* 1349–1351, (Jun. 1995).

Walczyk, F., et al., "Tailoring Interfacial Oxide for Polysilicon Bit–Cell Contacts and Emitters with In Situ Vapor HF Interface Cleaning and Polysilicon Deposition in a 4Mbit BiCMOS Fast Static RMA", *IEEE Bipolar Circuits and Technology Meeting,* 84–87, (1992).

Watanabe, A., et al., "SiC Thin Film Preparation by ArF Excimer Laser Chemical Vapor Deposition. Part 1: Rate of Photolysis of Alkylsilanes by ArF Excimer Laser and their Decomposition Products", *Thin Solid Films 274,* 70–75, (1996).

Wolter, S., et al., "Textured Growth of Diamond on Silicon via in situ Carburization and Bias–Enhanced Nucleation", *Appl. Phys. Lett., 62,* 1215–1217, (Mar. 1993).

Wu, K., et al., "The Growth and Characterization of Silicon/Silicon Carbide Heteroepitaxial Films on Silicon Substrates by Rapid Thermal Chemical Vapor Deposition", *Japanese J. Appl. Phys., 35,* 3836–3840, (1996).

Yamaguchi, Y., et al., "Properties of Heteroepitaxial 3C–SiC Films Grown by LPCVD", *Digest of Tech. Papers: 8th Int. Conf. on Solid–State Sensors and Actuators and Eurosensors IX, vol. 2,* Stockholm, Sweden, 190–193, (Jun. 1995).

Yamanashi, H., et al., "Deposition of Silicon Compound Thin Films in DC Discharge Plasma Using Hydrogen–Hexamethyldisilane Gas Mixture", *Proc.: Int. Symp. on Surfaces and Thin Films of Electronic Materials. Bull of the Res. Institute of Electronics, Shizuoka University, 30,* 95–98, (1995).

Ye, Q., et al., "Resonant Tunneling via Microcrystalline–silicon quantum confinement", *Physical Rev. B, 44,* 1806–1811, (1991).

Cherkasov, Y.A., et al., "Optical information media based on an amorphous photoconductor with high avalanche amplification—the amorphous analog of trigonal selenium", *Journal of Optical Technology, vol. 64, No. 7,* 627–32, (Jul. 7, 1997).

Fukuda, Y., et al., "A New Fusible–Type Programmable Element Composed of Aluminum and Polysilicon", *IEEE Trans. on Electron Devices, ED–33,* 250–253, (Feb., 1986).

Hanna, J., et al., "Early Stage of Polycrystalline Growth of Ge and SiGe by Reactive Thermal CVD from GeF(4) and Si(2)H(6)", *Materials Res. Soc. Symp. Proc., 358,* Boston, MA, 877–881, (Nov./Dec., 1994).

Hansen, P., *Constitution of Binary Alloys,* McGraw–Hill, New York, 103, (1958).

Hiraki, A., et al., "Formation of Silicon Oxide over Gold Layers on Silicon Substrates", *J. Applied Physics, 43,* 3643–3649, (Sep., 1972).

Hiraki, A., et al., "Low–Temperature Migration of Silicon in Metal Films on Silicon Substrates Studiedby Backscattering Techniques", *J. Vacuum Science and Tech., 9,* 155–158, (Jan./Feb., 1972).

Horie, H., et al., "Novel High Aspect Ratio Aluminum Plug for Logic/DRAM LSI's Using Polysilicon–Aluminum Substitute", *Technical Digest: IEEE International Electron Devices Meeting,* San Francisco, CA, 946–948, (1996).

Hurley, P., et al., "Low Temperature Plasma Oxidation of Polycrystalline Silicon", *Proc. 7th European Conf. on Insulating Films on Semiconductors: Contributed Papers, Section 5,* IOP Publishing Ltd., 235–238, (1991).

Hwang, J., et al., "Novel Polysilicon/TiN Stacked–Gate Structure for Fully–Depleted SOI/CMOS", *Technical Digest: Int. Electron Devices Meeting,* San Francisco, CA, 345–348, (Dec. 1992).

King, T. et al., "Deposition and Properties of Low–Pressure Chemical–Vapor Deposited Polycrystalline Silicon–Germanium Films", *J. Electrochemical Society, 141,* 2235–2241, (Aug. 1994).

Lee, D.H., et al., "Gate Oxide Integrity (GOI) of MOS transistors with W/TiN stacked gate", *1996 Symposium on VLSI Technolgoy Digest of Technical Papers,* 208–209, (1996).

Li, C., et al., "Low Temperature Heteroepitaxial Growth of Si(1–x)Ge(x)–on–Si by Photo–Enhanced Ultra High Vacuum Chemical Vapor Depostion Using Si(2)H(6) and Ge(2)H(6)", *J. Electronic Materials, 24,* 875–884 (Jul. 1995).

Li, P., et al., "Formation of Stoichiometric SiGe Oxide by Electron Cyclotron Resonance Plasma", *Appl. Phys. Lett, 60,* 3265–3267, (Jun. 1992).

Lyman, T.e., "Metallography, Structure and Phase Diagrams", *Metals Handbook, 8,* American Society for Metals; Metals Park, Ohio, 253, 256, 260, 263,, (1989).

Mohajerzadeh, S., et al., "A Low Energy Ion Beam Assisted Deposition Technique for Realizaing iso–type SiGe/Si hetero–interface diodes", *Thin Solid Films, 283,* 182–187, (1996).

Mohajerzadeh, S., et al., "A Low–Temperature Ion Vapor Deposition Technique for Silicon and Silicon–Germanium Epitaxy", *Candian J. Physics, 74,* S69–S73, (1996).

Mohri, M., et al., "Effect of SiF(4)/SiH(4)/H(2) Flow Rates on Film Properties of Low–Temperature Polycrystalline Silicon Films Prepated by Plasma Enhance Chemical Vapor Deposition", *IEICE Transactions on Electronics, E77–C,* 1677–1684, (Oct. 1994).

Mukhopadhyay, M., et al., "Properties of SiGe Oxides Grown in a Microwave Oxygen Plasma", *J. Applied Physics, 78,* 6135–6140, (Nov. 1995).

Predel, B., et al., "Die Zustandsdiagramme Silber–Germanium–Silizium und Gold–Germanium–Silizium", *J. Less Common Metals, 44,* 39–49, (Jan. 1976).

Schadel, H., et al., "Activity of Liquid Silver–Silicon Alloys", *Trans. American Institute of Mining and Metallurgical Engineers, 188,* 1282–1283, (Oct. 1950).

Shuto, S., et al., "Read Disturb Degradation Mechanism for Source Erase Flash Memories", *1996 Symposium on VLSI Technology, Digest of Technical Papers,* Honolulu, HI, 242–43, (1996).

Ushiku, Y., et al., "Planarized Silver Interconnect Technology with a Ti Self–Passivation Technique for Deep Sub–Micron ULSIs", *1993 Symp. on VLSI Technology: Digest of Technical Papers,* 121–122, (1993).

Wu, S., et al., "Suppression of the Boron Penetration Induced Si/SiO2 Interface Degradation by Using a Stacked–Amorphous–Silicon Film as the Gate Structure for pMOSFET", *IEEE Electron Device Letters, 15,* 160–162, (May 1994).

\* cited by examiner

METHODS AND STRUCTURES FOR SILVER INTERCONNECTIONS IN INTEGRATED CIRCUITS

This application is a Divisional of U.S. Ser. No. 09/030,113, filed Feb. 25, 1998 now U.S. Pat. No. 6,143,655.

BACKGROUND OF THE INVENTION

The present invention concerns methods of making, or fabricating, integrated circuits, particularly methods of forming silver interconnects.

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then "wired," or interconnected, together to define a specific electric circuit, such as a computer memory or microprocessor.

Interconnecting millions of microscopic components typically entails covering the components with an insulative layer, digging small holes in the insulative layer to expose portions of the components underneath, and digging trenches from each hole to one or more other holes in the layer. Then, through metallization, the holes and trenches are filled with aluminum (or an aluminum alloy) to form aluminum interconnects, or wires, between the components.

To fill the trenches and holes, fabricators cover the entire insulative layer with a thin layer, or film, of aluminum, and then selectively dissolve, or etch, away the aluminum that lies outside the holes and trenches. The selective etching requires the use of photolithography, a photographic-patterning technique, to form an etch-resistant mask, which protects the aluminum-filled holes and trenches from the etchant. The resulting aluminum wires, intended to be flush, or coplanar, with the surface of the underlying insulative layer, are typically about one micron thick, or about 100 times thinner than a human hair.

These conventional interconnection techniques suffer from at least three significant shortcomings. First, because of the difficulty of using photolithography to form high-precision masks on bumpy, uneven surfaces, conventional techniques require digging trenches to ensure that the deposited aluminum wires are flush, or coplanar, with the surface of the underlying insulation. However, digging these trenches is a time-consuming step which ultimately increases the cost of manufacturing integrated circuits.

Secondly, conventional techniques produce wires of aluminum, which not only has a higher electrical resistance, but also a lower electromigration resistance than other metals, such as silver. High electrical resistance wastes power, and low electromigration resistance means that, at certain electric current levels, the aluminum readily diffuses, or migrates, into neighboring structures, eventually thinning or breaking the wires and thus undermining reliability of integrated circuits.

Moreover, although silver has a 40-percent lower electrical resistivity and at least 100-percent higher electromigration resistance than aluminum, conventional interconnection techniques are impractical for making silver interconnects. In a particular, silver, a noble metal, is immune to most etchants. In fact, attempts to selectively etch a layer of silver covered with an etch-resistant mask usually dissolve the mask, not the silver. Thus, conventional etch-based techniques are wholly inadequate to form silver interconnects.

Thirdly, in addition to being time-consuming because of the trench-digging step and ineffective with more desirable metals such as silver, conventional techniques place aluminum wires in relatively high-capacitance insulators, typically solid silicon oxide. High capacitance slows the response of integrated circuits to electrical signals, a great disadvantage in computers and other systems including the integrated circuits.

Accordingly, there is not only a need for new interconnection methods that eliminate the trench-digging step, but also methods that yield less-resistive, less-capacitive, and more-reliable silver-based interconnects for faster and more-efficient integrated circuits.

SUMMARY OF THE INVENTION

To address these and other needs, the present invention provides a new method of making coplanar silver and insulative structures for an integrated circuit. Specifically, one embodiment of the method entails forming a first layer that includes silicon and germanium, and then oxidizing a region of the first layer to define an oxidized region and a non-oxidized region. After oxidation, the method reacts silver with the non-oxidized region. The reaction substitutes, or replaces, the non-oxidized region with silver to form a silver structure flush or coplanar with the first layer. Another step removes germanium oxide from the oxidized region to surround the silver structure in a porous insulative member which reduces capacitance.

Thus, the method of the present invention yields a self-planarizing silver structure that not only eliminates the time-consuming, trench-digging step of conventional methods, but also places the low-resistance, highly-reliable silver structure within a capacitance-reducing insulation that allows faster, more-efficient integrated circuits.

BRIEF DESCRIPTION OF THE DRAWINGS

The following figures are used to describe many aspects of the invention.

DESCRIPTION OF THE PREFERRED EMBODIMENTS

The following detailed description, which references and incorporates FIGS. 1–10, describes and illustrates specific embodiments of the invention. These embodiments, offered not to limit but only to exemplify and teach the invention, are shown and described in sufficient detail to enable those skilled in the art to implement or practice the invention. Thus, where appropriate to avoid obscuring the invention, the description may omit certain information known to those of skill in the art.

The detailed description includes two sets of separate but overlapping embodiments of the invention. The first set of embodiments, illustrated principally with FIGS. 1–8, pertains to a preferred method of making single- and multi-level interconnective structures. The second set of embodiments, illustrated principally with FIGS. 9 and 10, concern hybrid interconnect structures which combine air bridges with structures exemplified in the first set of embodiments.

Preferred Method of Making Single- and Multi-Level Interconnects

Figure 1:
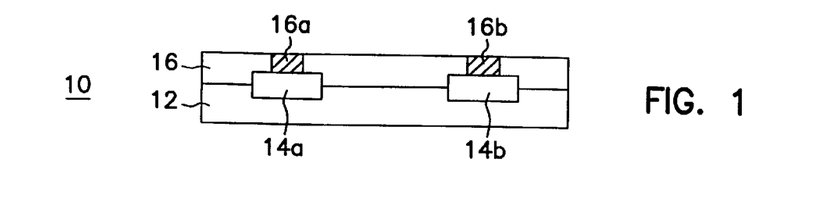
FIG. 1 is a cross-sectional view of an integrated-circuit assembly.

FIGS. 1–8 show a number of preferred integrated-circuit assemblies, which taken collectively and sequentially, illustrate the preferred method of making single- and multi-level interconnects. The method, as shown in FIG. 1, begins with a known integrated-circuit assembly or structure 10. Assembly 10 includes a substrate 12. The term "substrate" encompasses a semiconductor wafer as well as structures having one or more insulative, conductive, or semiconductive layers and materials. Thus, for example, the term embraces silicon-on-insulator, silicon-on-sapphire, and other advanced structures.

Substrate 12 supports a number of integrated elements, preferably transistors 14a and 14b. Transistors 14a and 14b are covered by an insulative layer 16, which preferably comprises silicon oxide, nitride, or oxynitride. Layer 16 includes two tungsten vias 16a and 16b electrically connected to respective transistors 14a and 14b. Although omitted from FIGS. 1–8 for clarity, assembly 10 preferably includes a titanium-nitride diffusion barrier between vias 16a and 16b and transistors 14a and 14b.

Figure 2:
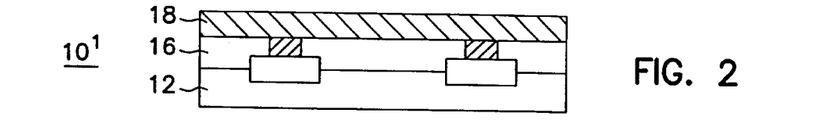
FIG. 2 is a cross-sectional view of the FIG. 1 integrated-circuit assembly after formation of a silicon-germanium layer.

Next, as FIG. 2 shows, the preferred method forms a polycrystalline, silicon-germanium (SiGe) layer 18 on insulative layer 16 and over vias 16a and 16b. In the preferred embodiment, silicon-germanium layer 18 consists of 10–60 percent germanium (by weight). Because of the low solubility of silicon in silver, compared to silicon in germanium, as well as to produce a low-dielectric insulator, a high germanium content, such as 50 percent, is preferred. The thickness of the silicon-germanium layer, approximately one micron, matches the thickness of the desired silver structure.

Silicon-germanium layer 18 is preferably formed through conventional low-pressure chemical-vapor deposition (LP-CVD), specifically the pyrolysis of silicon hydride ($SiH_4$) and germanium hydride ($GeH_4$) gases at a temperature as low as 400° C. For more details on this technique, which controls the silicon-germanium composition by varying the gas flow rates, refer to the T. J. King article, entitled "Deposition and Properties of Low-Pressure Chemical-Vapor Deposited Polycrystalline Silicon-Germanium Films," in the Journal of the Electro-Chemical Society (pp. 2235–41, August 1994). This article is incorporated by reference.

Figure 3A:
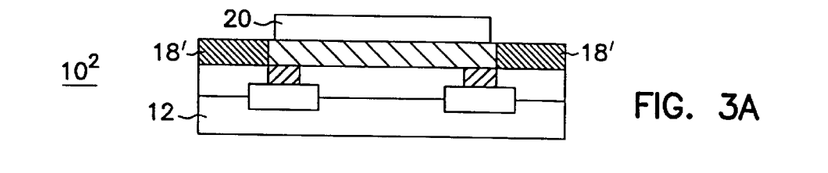
FIG. 3A is a cross-sectional view of the FIG. 2 integrated-circuit assembly after formation of an oxidation mask.

In FIG. 3A, the method forms an oxidation mask 20 on silicon-germanium layer 18. This mask defines a narrow, rectangular channel which ultimately defines the periphery of a conductor connecting vias 16a and 16b and thus transistors 14a and 14b. A top view of mask 20 and its relation to transistors 14a and 14b and vias 16a and 16b is shown in FIG. 3B.

To form mask 20, the method deposits a layer of silicon nitride ($Si_3N_4$), using low-pressure or plasma-enhanced chemical-vapor deposition. Conventional lithographic techniques define the mask, finally formed through reactive-ion or plasma etching of the silicon-nitride layer. The actual mask thickness, which preferably ranges between 30 and 100 nanometers, depends on the etchant used to remove the unwanted silicon nitride.

After completion of mask 20, the method oxidizes silicon-germanium layer 18. This oxidization defines regions under mask 20 as non-oxidized regions and unmasked regions as oxidized regions. The oxidized regions contain an extractable or removable germanium oxide, which can be removed to leave a porous insulator having a low dielectric constant. The non-oxidized regions eventually become the metallic or conductive member connecting transistors 14a and 14b. In the preferred embodiment, the oxidation is performed in microwave-enhanced plasma to occur at temperatures as low as 200° C. The results of oxidation are shown as regions 18' in FIG. 3A.

Figures 3B, 4:
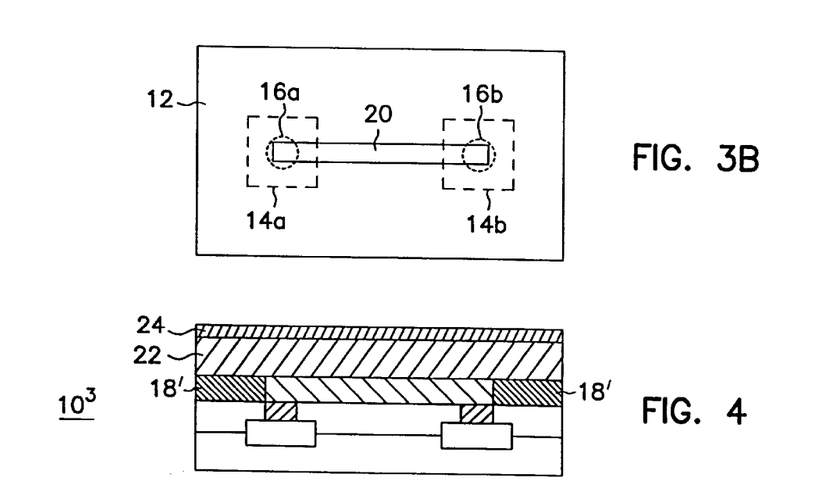
FIG. 3B is a top view of the FIG. 3A integrated-circuit assembly, showing the oxidation mask.
FIG. 4 is a cross-sectional view of the FIG. 3 integrated-circuit assembly after oxidation, removal of the oxidation mask, and formation of a silver layer and a zirconium layer.

In FIG. 4, the method entails removing mask 20, preferably through reactive-ion etching, chemical etching, or chemical-mechanical polishing, to leave silicon-germanium layer 18 with a planar surface for depositing silver. Afterward, physical or chemical-vapor deposition forms a 1.5-micron-thick, silver layer 22 on the oxidized and non-oxidized regions of layer 16.

Next, the method forms a 200-nanometer-thick, zirconium layer 24 on layer 22 by physical vapor deposition. In other embodiments, layer 24 is between 20 and 250 nanometers thick and comprises titanium or hafnium, instead of zirconium. Zirconium is preferred because of its lower solubility in silver. Layer 24 not only reduces the temperature and time necessary to complete the next step, but also improves the contact resistance between the silver layer and any subsequent via level.

Figure 5:
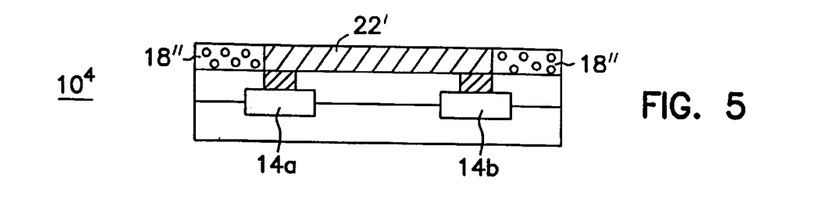
FIG. 5 is a cross-sectional view of the FIG. 4 assembly after reaction of the silver layer and the silicon-germanium layer.

The next step forces a metal-substitution reaction between silver layer 22 and the non-oxidized regions of silicon-germanium layer 18, thereby substituting, or replacing, the non-oxidized regions of silicon-germanium layer 18 with silver from silver layer 22. Consequently, a coplanar (or at least partially submerged) metallic structure 22, consisting essentially of silver with small amounts of silicon and germanium, forms in silicon-germanium layer 18. Thus, unlike conventional techniques that require trench-digging before metal deposition to ensure co-planarity of the metallic structures and underlying insulative structures, the present method is "self-planarizing" or "self-trenching."

More specifically, to force the metal-substitution reaction, the method heats the integrated-circuit assembly to 500–600° C. in a vacuum, nitrogen, argon, or other non-oxidizing atmosphere for approximately 60 minutes. Heating urges diffusion of portions of metal layer 22 into adjacent non-oxidized portions of silicon-germanium layer 18 and vice versa. The substitution temperature, that is, the annealing temperature, should be lower than 651° C., which is the eutectic (lowest melting) temperature of the ternary silver-silicon-germanium system for the reaction or substitution to occur.

Forming-gas or other hydrogen-containing atmospheres are not used at the 500–600° C. temperatures because of the tendency to saturate zirconium layer 24 with hydrogen and form zirconium hydride. However, if the process is performed below 400° C., a forming-gas atmosphere is feasible.

After the metal-substitution reaction, a small amount of germanium may remain on silver structure 22. Additionally, any silver that remains on the surface of layer 18 may contain zirconium silicide and silicon-germanium agglomerates. These are removed by chemical mechanical polishing or other suitable techniques.

Then, to reduce the dielectric constant of oxidized regions 18', germanium oxide in the oxidized regions of silicon-germanium layer 18 is removed using a wet etchant, such as distilled or deionized water. This leaves a porous oxide, insulative structure having a dielectric constant about one half that of conventional solid oxide insulators. (However, this reduction in dielectric constant depends on the original composition of silicon-germanium layer 18, which in the preferred embodiment is 50 percent germanium.) The lowered dielectric constant ultimately reduces capacitance which, in turn, yields a faster, more efficient integrated circuit.

Figure 6A:
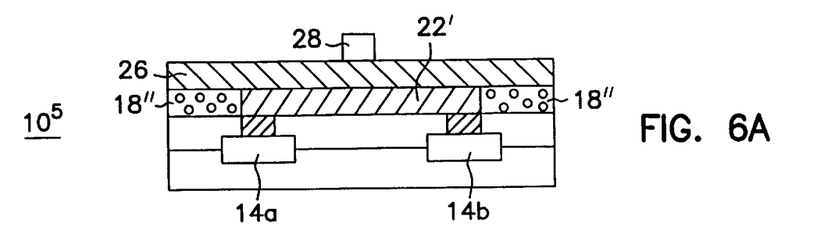
FIG. 6A is a cross-sectional view of the FIG. 5 integrated-circuit assembly after formation of a silicon-germanium layer and an oxidation mask.
Figure 6B:
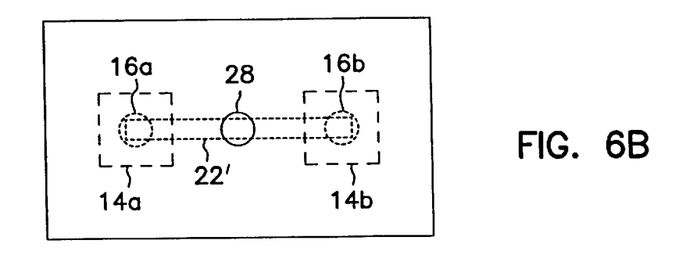
FIG. 6B is a top view of the FIG. 6A integrated-circuit assembly, showing the oxidation mask.
Figure 7:
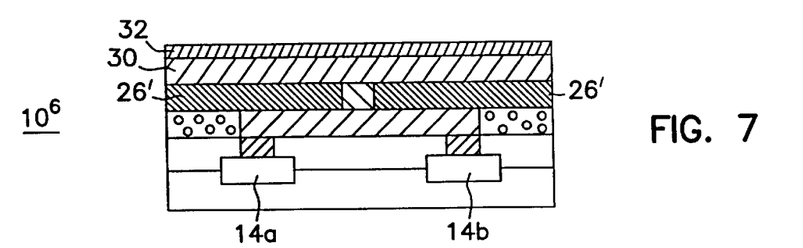
FIG. 7 is a cross-sectional view of the FIG. 6 integrated-circuit assembly after oxidation, removal of the oxidation mask, and formation of a silver layer and a titanium layer.

Further fabrication of more interconnection or metallization levels would entail repeating the steps already described and illustrated. For example, to form a second level that includes a via, the preferred embodiment, illustrated in FIG. 6A, forms a second silicon-germanium layer 26 and then an oxidation mask 28 defining a position of the via relative conductor 22'. FIG. 6B shows a top view of mask 28 and its position relative conductor 22'. After oxidizing silicon-germanium layer 26 and then removing oxidation mask 28, the method forms a second silver layer 30 and a second zirconium layer 32 as FIG. 7 shows. The integrated-circuit assembly is then heated to force the metal-substitution reaction, thereby substituting a portion of silver layer 30 for non-oxidized region of layer 26, and forming a substantially coplanar via 30'.

Notably, unlike conventional techniques that require forming an insulative layer, etching holes to define the vias, and then finally filling these holes with metal to form the vias, this technique proceeds without etching holes and without filling holes. Thus, the present invention provides an "etchless" or "hole-less" method of forming vias.

Figure 8:
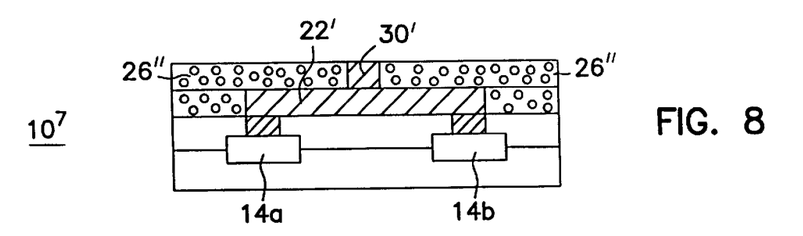
FIG. 8 is a cross-sectional view of the FIG. 7 assembly after reaction of the silver layer and the silicon-germanium layer.

After forming via 30', wet etching removes germanium oxide from regions 26' to form porous low-dielectric insulation around via 30'. The resulting integrated-circuit assembly is depicted in FIG. 8. Subsequent metallizations would follow similarly. (However, one should take care to ensure that both the deposition and oxidation temperatures for subsequent silicon-germanium layers are lower than the substitution temperature, 651° C. in the preferred embodiment, to avoid causing substitution from underlying silver structures.)

With completion of the desired number of metallization levels, the preferred method ultimately concludes by heat-treating the integrated circuit for one to six hours at a temperature between 100 and 200° C. This heat treatment, which preferably occurs after packaging the integrated circuit in a protective housing, ensures that the metallic structures have minimum resistivity.

Preferred Hybrid Interconnects Incorporating Low-Capacitance Air Bridge

Figure 9:
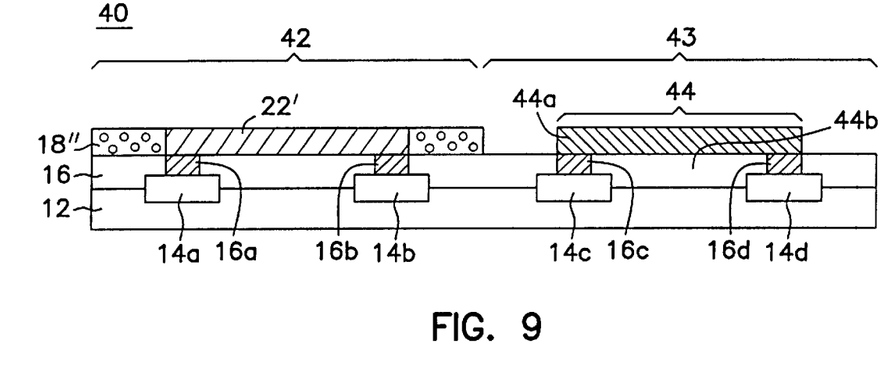
FIG. 9 is a cross-sectional view of an integrated-circuit assembly embodying a coplanar hybrid interconnect system.
Figure 10:
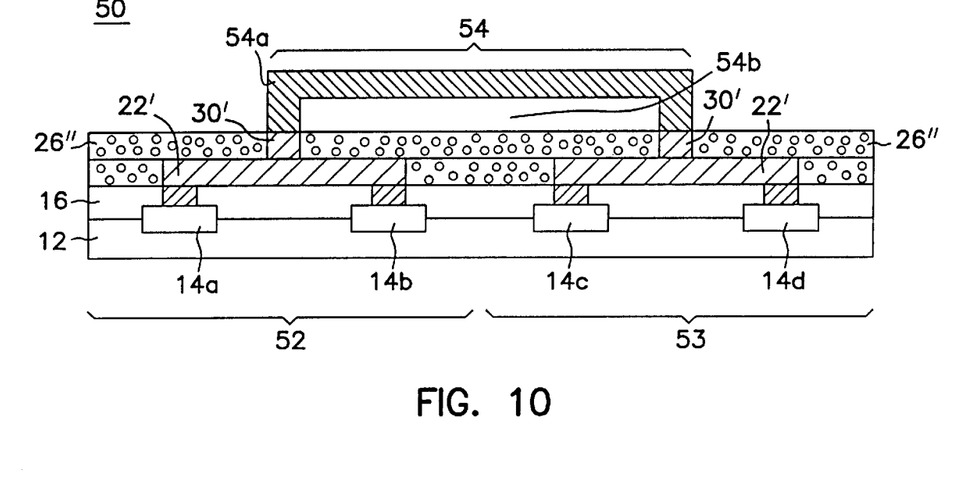
FIG. 10 is a cross-sectional view of an integrated-circuit assembly embodying a two-level (non-coplanar) hybrid interconnect system.

FIGS. 9 and 10 show two integrated-circuit assemblies which respectively combine the low-capacitance interconnect structures of FIGS. 3 and 8 with low-capacitance air bridges to yield new hybrid structures. In particular, FIG. 9 shows an integrated-circuit assembly 40 embodying a coplanar hybrid interconnect system which combines two distinct types of low-capacitance interconnect structures: a first interconnect structure 42 (on the left), and a second interconnect structure 43 (on the right). Structure 42, identical to the previously described structure of FIG. 5, connects transistors 14a and 14b on substrate 12 via conductive vias (or contacts) 16a and 16b and silver conductor 22'. For reduced capacitance, conductor 22' is embedded in porous insulation 18" which has a low dielectric constant. Structure 42 is preferably formed as detailed through the above-description of FIGS. 1–5.

Interconnect structure 43 comprises an air bridge 44, which in turn comprises an aluminum conductor 44a and air cavity 44b. Conductor 44a, which is substantially coplanar to conductor 22', electrically connects vias 16c and 16d and thus electrically connects corresponding transistors 14c and 14d. The presence of air cavity 44b, which has a unity or near-unity dielectric constant lower than even that of porous insulation 18", minimizes line capacitance between these transistors.

Air bridge 44 is built conventionally by forming conductor 44a on an underlying, sacrificial support structure (not shown) and then removing the support structure to leave air cavity 44b. In conventional processing, the sacrificial support structure consists of photoresist or other material which can be easily dissolved or etched away. For further details on this known process, see U.S. Pat. No. 5,510,645 entitled Semiconductor Structure Having an Air Bridge and Method of Forming the Semiconductor Structure and U.S. Pat. No. 5,324,684 entitled Method of Forming Semiconductor Structure Having an Air Bridge, both issued to Fitch et al. and both incorporated herein by reference.

Fabrication of air bridge 44 may occur before, after, or concurrent with the fabrication of structure 42. For example, vias 16c and 16d may be formed simultaneously with vias 16a and 16b or started during the metal substitution reaction that forms conductor 22'. However, one should take care to avoid exceeding the substitution temperature; otherwise undesired substitution of silver may occur.

FIG. 10 shows an integrated-circuit assembly 50 embodying a two-level (non-coplanar) hybrid interconnect system which, like assembly 40, combines two types of low-capacitance interconnect structures. Assembly 50 includes an air bridge 54 which connects integrated-circuit assemblies 52 and 53. Assemblies 52 and 53, both of which are structurally identical to the previously described assembly of FIG. 8, embed aluminum conductors 22' in porous insulation 26". Conductors 22" are connected to vias 30', which are electrically connected via air bridge 54.

Air bridge 54 comprises aluminum conductor 54a and air cavity 54b. Conductor 54a, which occupies a plane above that of conductors 22', electrically connects vias 30' and thus electrically connects transistors 14a and 14b to transistors 14c and 14d. Air bridge 54 as well as assemblies 52 and 53 are fabricated according the methods described above.

CONCLUSION

The present invention overcomes at least three significant shortcomings of conventional interconnection techniques.

First, unlike previous techniques that require digging trenches in an insulative layer before metallization to ensure a coplanar metallic structure, the invention provides a self-planarizing or self-trenching metallization process, which directly substitutes metal for select portions of an insulative layer, thereby skipping the time-consuming trench-digging step. Relatedly, the invention forms vias without the conventional steps of etching and filling holes with metal.

Second, unlike conventional techniques which are limited to forming interconnects from aluminum, the invention forms interconnects from silver, which has 40-percent lower electrical resistance and at least 100-percent higher electromigration resistance. Thus, the invention yields integrated circuits with superior efficiency and reliability.

Third, unlike conventional techniques that bury aluminum wiring in solid high-capacitive insulation, the invention places silver wiring in porous low-capacitive insulation which ultimately yields faster integrated circuits. In short, the invention not only eliminates the time-consuming, trench-digging step, but also yields integrated circuits that operate with superior speed, reliability, and economy.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

What is claimed is:

1. An integrated-circuit assembly comprising:
   first and second integrated devices;
   a first layer including first and second conductive members contacting the respective first and second integrated devices;
   a silicon-germanium layer having oxidized and non-oxidized regions, with the non-oxidized region contacting the first conductive member; and
   a silver layer contacting at least a portion of the non-oxidized region.

2. The integrated-circuit assembly of claim 1, further comprising:
   a titanium, zirconium, or hafnium layer contacting the silver layer.

3. An integrated-circuit assembly comprising:
   an air bridge having a first conductor and a cavity adjacent the first conductor; and
   a silver conductor at least partially submerged in a porous insulator, the silver conductor electrically coupled to the first conductor.

4. The integrated-circuit assembly of claim 3, wherein the porous insulator consists essentially of a silicon oxide.

5. An assembly for an integrated circuit, comprising:
   a supporting surface;
   first and second transistor regions supported by the supporting surface;
   a first interconnect structure supported by the supporting surface and including a silver conductor, the silver conductor at least partially submerged in a porous insulator, and electrically coupled to the first transistor region; and
   a second interconnect structure supported by the supporting surface and including an air-bridge conductor electrically connected between the silver conductor and the second transistor region.

6. The assembly of claim 5, wherein the silver conductor and the air-bridge conductor occupy a common plane which is substantially parallel to the supporting surface.

7. The integrated-circuit assembly of claim 1, wherein the oxidized and non-oxidized regions have substantially coplanar portions.

8. The integrated-circuit assembly of claim 3, wherein the silver conductor and the porous insulator have substantially coplanar portions.

9. The assembly of claim 5, wherein the second interconnect structure overlies the first interconnect structure.

10. An integrated-circuit assembly, comprising:
    first and second integrated devices;
    a first layer including first and second conductive members respectively electrically coupled to the first and second integrated devices; and
    a second layer including a silver conductor at least partially submerged in a porous insulator, the silver conductor electrically coupled to the first and second conductive members.

11. The integrated-circuit assembly of claim 10, further comprising:
    a silver layer contacting at least a portion of the non-oxidized region.

12. The integrated-circuit assembly of claim 11, further comprising:
    a titanium, zirconium, or hafnium layer contacting the silver layer.

13. The integrated-circuit assembly of claim 10, further comprising:
    a third layer including a silver conductor at least partially submerged in a porous insulator, the silver conductor of the third layer electrically coupled to the silver conductor of the second layer.

14. The integrated-circuit assembly of claim 10, wherein the silver conductor is substantially coplanar with the porous insulator.

15. An integrated-circuit assembly comprising:
    first and second integrated devices;
    a first layer including first and second conductive members respectively electrically coupled to the first and second integrated devices;
    a second layer including a silver conductor at least partially submerged in a porous insulator, the silver conductor electrically coupled to the first and second conductive members; and
    a silicon-germanium layer contacting the second layer.

16. The integrated-circuit assembly of claim 15, wherein the silver conductor is substantially coplanar with the porous insulator.

17. An integrated-circuit assembly comprising:
    first and second integrated devices;
    a first layer including first and second conductive members respectively electrically coupled to the first and second integrated devices;
    a second layer including a silver conductor at least partially submerged in a porous insulator, the silver conductor electrically coupled to the first and second conductive members;
    a silicon-germanium layer having oxidized and non-oxidized regions with non-oxidized regions contacting the second layer;
    a silver layer contacting at least a portion of the non-oxidized regions; and
    a titanium, zirconium, or hafnium layer contacting the silver layer.

18. The integrated-circuit assembly of claim 17, wherein the silver conductor is substantially coplanar with the porous insulator.

19. An integrated-circuit assembly comprising:

first and second integrated devices:
- a first layer including first and second conductive members respectively electrically coupled to the first and second integrated devices;
- a second layer including a silver conductor at least partially submerged in a porous insulator, the silver conductor electrically coupled to the first and second conductive members;
- a third layer including a silver conductor at least partially submerged in a porous insulator, the silver conductor of the third layer electrically coupled to the silver conductor of the second layer.

20. The integrated-circuit assembly of claim 19, wherein each silver conductor is substantially coplanar with its porous insulator.

21. The integrated circuit assembly of claim 19, wherein the second layer overlies the first layer and the third layer overlies the second layer.

22. An assembly for an integrated circuit, comprising:
- a supporting surface;
- first and second transistor regions supported by the supporting surface;
- a first interconnect structure supported by the supporting surface and including a silver conductor, the silver conductor at least partially submerged in a porous insulator, and electrically coupled to the first transistor region; and
- a second interconnect structure supported by the supporting surface and including an air-bridge conductor electrically coupled to the silver conductor and the second transistor region, wherein the second interconnect structure overlies the first interconnect structure.

23. The assembly of claim 22, wherein the silver conductor is substantially coplanar with its porous insulator.

24. An integrated-circuit assembly comprising:
- first and second transistors;
- first and second silver conductors respectively electrically coupled to the first and second transistors; and
- an air bridge electrically coupled to the first and second silver conductors.

25. The integrated-circuit assembly of claim 24, wherein the silver conductors overlie the transistors and the air bridge overlies the silver conductors.

* * * * *

UNITED STATES PATENT AND TRADEMARK OFFICE
CERTIFICATE OF CORRECTION

PATENT NO. : 6,541,859 B1
DATED : April 1, 2003
INVENTOR(S) : Leonard Forbes, Kie Y. Ahn and Paul A. Farrar It is certified that error appears in the above-identified patent and that said Letters Patent is hereby corrected as shown below:

<u>Title page,</u>
Item [56], References Cited, U.S. PATENT DOCUMENTS, delete "et al." after "Ellsworth".
OTHER PUBLICATIONS, "Demichelis, F., et al." reference, delete "SiC:" and insert -- SiC:H-- therefor.
"Fissel, et al.," reference, insert -- A., -- after "Fissel,".
"Hybersten, M.S.," reference, delete "Hybersten" and insert -- Hybertsen -- therefor.
"Lakshmi, E., et al.," reference, delete "Interference" and insert -- Interface -- therefor.
"Rahman, M., et al.," reference, delete "in" and insert -- n -- therefor.
"Thomas J., et al.," reference, insert -- , -- after "Thomas".
"Walczyk, F., et al.," reference, delete "RMA" and insert -- RAM -- therefor.

<u>Column 4,</u>
Line 41, delete "16" and insert -- 18 -- therefor.
Line 56, delete "22" and insert -- (or conductor) 22' -- therefor.
Line 57, delete "," after "with".

<u>Column 5,</u>
Line 13, delete "silver structure 22" and insert -- metallic structure 22' -- therefor.

Signed and Sealed this

Sixth Day of July, 2004

JON W. DUDAS
*Acting Director of the United States Patent and Trademark Office*